(12) United States Patent
Yamada

(10) Patent No.: US 6,781,884 B2

(45) Date of Patent: Aug. 24, 2004

(54) SYSTEM FOR SETTING MEMORY VOLTAGE THRESHOLD

(75) Inventor: Shigekazu Yamada, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/096,338

(22) Filed: Mar. 11, 2002

(65) Prior Publication Data

US 2003/0169623 A1 Sep. 11, 2003

(51) Int. Cl.[7] .............................................. G11C 16/06
(52) U.S. Cl. ................................................. 365/185.22
(58) Field of Search ....................... 365/185.22, 185.24, 365/210, 200

(56) References Cited

U.S. PATENT DOCUMENTS 5,798,966 A * 8/1998 Keeney ................. 365/185.18

6,344,999 B1 * 2/2002 Iwahashi ............... 365/185.24

* cited by examiner

*Primary Examiner*—Thong Q. Le
(74) *Attorney, Agent, or Firm*—Sheppard Mullin Richter & Hampton LLP

(57) ABSTRACT

System to set threshold voltages in a memory device. The system includes apparatus to set voltage threshold levels of a plurality of memory cells in a memory device. The plurality of memory cells are coupled to a common word line. The apparatus includes a plurality of gates that are coupled between a voltage source and the plurality of memory cells, the gates include control inputs that receive control signals that open and close each gate, so that when a selected gate is closed, the voltage source is coupled to a selected memory cell and when the selected gate is open the current source is uncoupled from the selected memory cell. The apparatus also includes control logic that generates the control signals to open and close the gates to individually enable and disable programming of the voltage threshold of each of the memory cells.

8 Claims, 2 Drawing Sheets

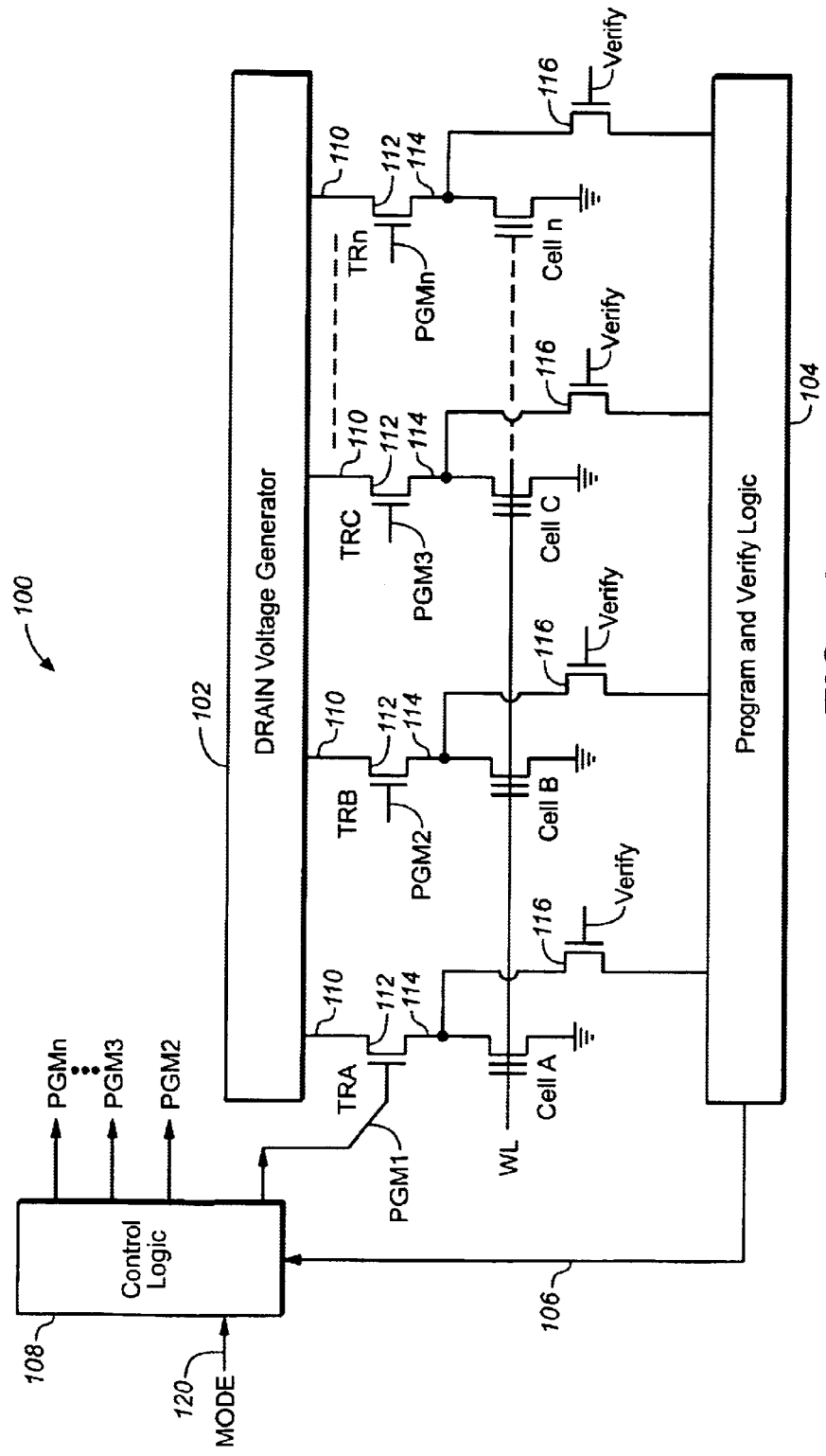
FIG._1

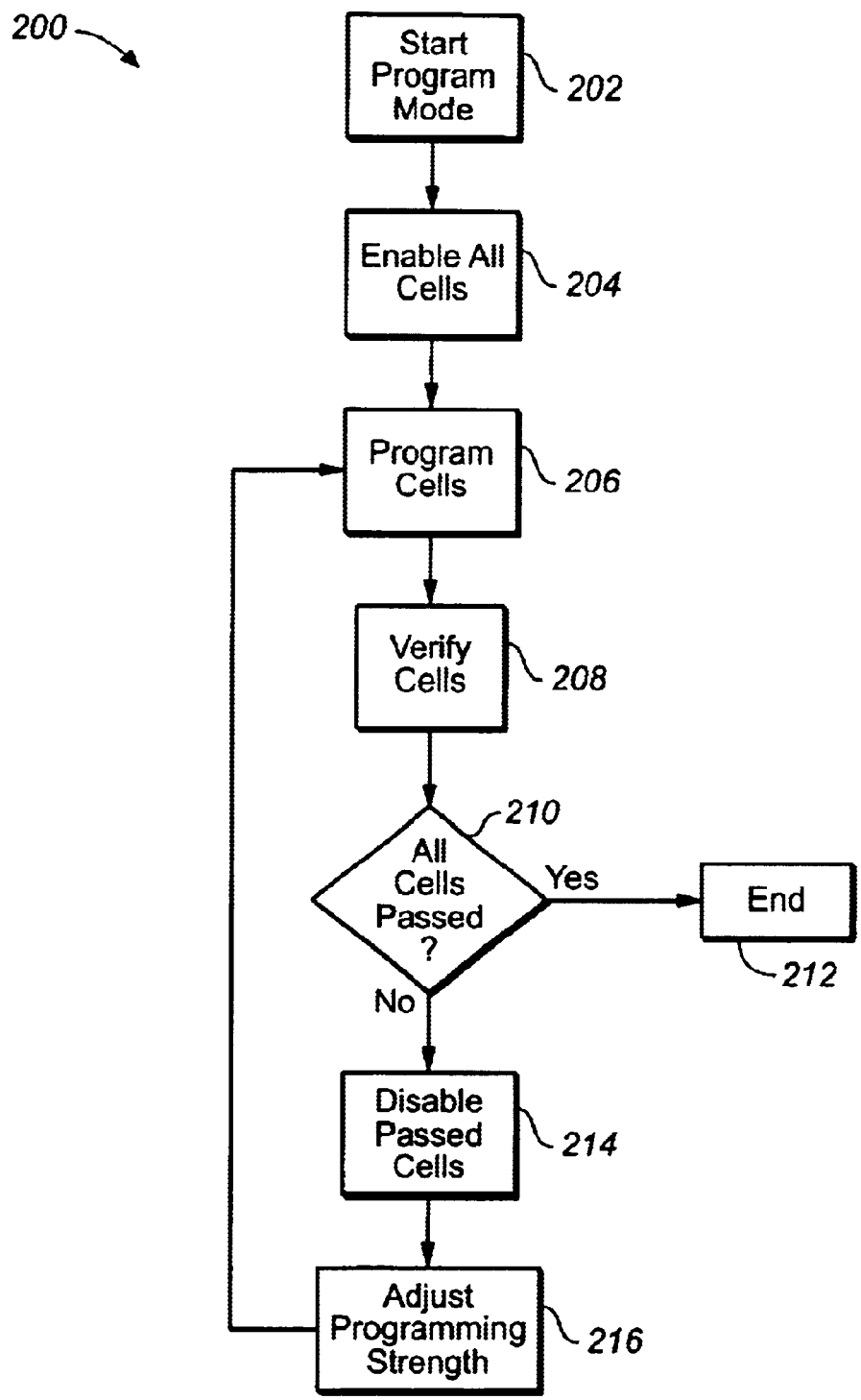
FIG._2

SYSTEM FOR SETTING MEMORY VOLTAGE THRESHOLD

FIELD OF THE INVENTION

The present invention relates to semiconductor memory devices, and more particularly, to a system for setting voltage thresholds of memory cells in a memory device.

BACKGROUND OF THE INVENTION

Semiconductor devices, such as memory devices, are commonly used as information storage devices in digital systems. As the amount of information that needs to be stored increases, it has become increasingly important to have an efficient way of accessing such memory devices.

Generally, memory read or write operations are initiated in response to external signals provided to the memory by a controller, such as a processor. In most cases, the amount of information that needs to be transferred during a memory access is large. In addition, the rate at which the information is propagated from a processor to a memory device and vice versa continues to increase. Therefore, increasing performance demands are being placed on the ability to read and write information to memory devices.

In a FLASH memory device, multiple core cells are programmed simultaneously. Since the core cells are in the same word, the programmed voltage thresholds (Vth) are generally the same from cell to cell. However, there are several cases where it is desirable to set the programmed Vth individually for each cell. One way to do this is to program the cells one by one while changing the programming conditions and program verify levels for each cell. Unfortunately, this type of individual programming takes excessive amounts of time to complete the programming of all core cells.

Therefore, it would be desirable to have a way to quickly program core cells to set individual Vth levels for each cell in a memory device.

SUMMARY OF THE INVENTION

The present invention includes a system for setting voltage thresholds in a memory device. The system operates by selectively enabling and disabling programming pulses for all memory cells associated with a selected word line. Thus, the system achieves fast programming times since the memory cells are programmed in parallel, and it is possible to obtain desired voltage thresholds for the programmed cells.

In one embodiment of the present invention, apparatus is provided to set voltage threshold levels of a plurality of memory cells in a memory device. The plurality of memory cells are coupled to a common word line. The apparatus includes a plurality of gates that are coupled between a voltage source and the plurality of memory cells, the gates include control inputs that receive control signals that open and close each gate, so that when a selected gate is closed, the voltage source is coupled to a selected memory cell and when the selected gate is open the current source is uncoupled from the selected memory cell. The apparatus also includes control logic that generates the control signals to open and close the gates to individually enable and disable programming of the voltage threshold of each of the memory cells.

In another embodiment of the present invention, a method is provided for setting voltage threshold levels of a plurality of memory cells in a memory device. The plurality of memory cells are coupled to a common word line. The method includes the steps of gating a voltage source to the plurality of memory cells to enable programming of the plurality of memory cells, programming the enabled memory cells, verifying that at least a portion of the plurality of memory cells are programmed with a correct voltage threshold, disabling the voltage source to the at least a portion of the plurality of memory cells, and repeating the steps programming, verifying and disabling until all of the plurality of memory cells are programmed with the correct voltage threshold.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows one embodiment of a system for programming the voltage threshold of memory cells in accordance with the present invention; and FIG. 2 shows one embodiment of method for programming the voltage threshold of memory cells in accordance with the present invention.

DETAILED DESCRIPTION OF THE INVENTION

The present invention includes a system for setting voltage thresholds of memory cells in a memory device. The system operates by selectively enabling and disabling programming pulses for all memory cells associated with a selected word line. Thus, various embodiments of the system included in the present invention are discussed in detail in the following text.

Exemplary Embodiment

FIG. 1 shows one embodiment of a system 100 for setting voltage threshold levels of memory cells in a memory device in accordance with the present invention. The system 100 includes drain voltage generator 102 that includes outputs 110 to provide voltage for programming memory cells. The drain voltage generator is coupled to gate transistors TRA, TRB, TRC, and up to gate transistor TRn. The gate transistors include drain terminals 112 that are coupled to the drain voltage generator outputs. The gate transistors also include source terminals 114 that operate to provide the generator voltage when the gate transistors are in an active state.

The source terminals 114 are coupled to memory cells A, B, C and up to memory cell "hn." The memory cells are used to store information as part of a memory device. The memory cells are coupled to a common word line (WL) that provides signals used to program and access the memory cells. The memory cells are also coupled to ground terminals.

The outputs of the memory cells are coupled to program verify logic 104 via verify transistors 116. The verify logic operates to verify the data programmed into the memory cells. For example, the verify logic operates to read data programmed in the memory cells and compare the programmed data to the actual data used to program the memory cells. In some cases, the actual and programmed data will match, and those memory cells are considered to have "passed" the programming operation. In other cases, the actual and programmed data will not match, and those memory cells are considered to have "failed" the programming operation. In either case, the verify logic 104 outputs pass/fail results for the programming operation at verify output 106.

Control logic 108 operates to output programming gate signals PGM1, PGM2, PGM3, and up to PGMn. The programming gate signals are coupled to gate terminals of the gate transistors TRA, TRB, TRC, and up to gate transistor TRn. The gate signals are used to activate and deactivate the gate transistors. For example, when the gates signals activate the gate transistors (for example, when the gate signals are at a high voltage state), a low resistance connection between the drain and source terminals of the gate transistors is formed, so that the voltage at the voltage outputs 110 of the voltage generator 102 appears at the source terminals 114 of the gate transistors. When the gate signals deactivate the gate transistors, (for example, when the gate signals are at a low voltage state), a high resistance connection between the drain and source terminals of the gate transistors is formed, so that very little of the generated voltage appears at the source terminals 114. Thus, the control logic operates to generate programming gate signals that may each enable or disable a respective gate transistor.

The control logic 108 also receives a mode signal 120 that indicates a mode of operation of the memory. For example, the mode may indicate a program, verify, or erase mode of operation of the memory. The control logic is also coupled to receive the verify output 106. Thus, it is possible for the control logic 108 to determine an operating mode for the memory, receive pass/fail results during memory verify operations, and generate the programming control signals to selectively couple or uncoupled the drain voltage generator output to selected memory cells. As a result of the above, the system 100 can effectively set the Vth of the memory cells.

Exemplary Method of Operation

FIG. 2 shows one embodiment of method 200 for programming the voltage threshold of memory cells in accordance with the present invention. At block 202, the method begins when a programming mode begins. At this step, the control logic 108 receives the mode signal 100 indicating that the device is in the programming mode.

At block 204, memory cells are enabled to be programmed. For example, the control logic 108 generates the programming control signals so that each gate transistor is placed in the active state, whereby voltage generated by the voltage generated is coupled to the memory cells.

At block 206, the voltage thresholds of the memory cells are programmed in typical fashion. For example, the program and verify logic 104 operates to program the voltage thresholds of the memory cells using typical programming conditions (i.e., programming pulse strength and time duration).

At block 208, a verify operation begins wherein the threshold voltages programmed in the memory cells are verified. For example, the threshold voltage for each memory cell is checked to determine whether the desired threshold level for that memory cell was successfully programmed. As a result of the verify operation, the memory cells are given a pass or fail programming status. Memory cells that are successfully programmed are given a "pass" status and memory cells that are not successfully programmed are given a "fail" status. The results of the verify operation are provided at the verify output 106.

At block 210, a test is performed to determine if all memory cells have passed the programming operation. If all memory cells have passed the programming operation, then all memory cells have the desired voltage threshold level, and so the method is complete and proceeds to block 212. If not all memory cells have passed the programming operation then some of the memory cells have undesirable voltage threshold levels, and so the method proceeds to block 214.

At block 214, the memory cells that have passed the verify operation are disabled from further programming. For example, control logic 108 receives the results of the verify operation from the verify output 106. The control logic determines from the results of the verify operation which memory cells have passed, and for those memory cells, generates the associated programming gate signals so that the corresponding gate transistors are disabled. Thus, the passed memory cells are prevented from receiving voltage from the voltage generator 102. However, the gate transistors associated with failed memory cells remain enabled and in the active state as a result of the settings performed in block 204.

At block 216, an adjustment to the memory programming strength is made. For example, the memory programming strength is a combination of the voltage level of a programming pulse used to program the memory cells, and the duration of that pulse. Since the failed memory cells are already partially programmed from the previous programming cycle, it may only be necessary to provide a small amount of additional programming to program the failed memory cells to the desired voltage threshold levels. Thus, the programming strength may be weakened for successive programming cycles. For example, the programming pulse may be shorter or have less voltage amplitude.

After any adjustments to the programming strength, the method proceeds to block 206 where only the failed memory cells are reprogrammed. The reprogrammed cells are verified and any passed memory cells are disabled from further reprogramming, while any failed memory cells go through one or more additional reprogramming cycles. Thus, the method 200 continues until all the memory cells are programmed to the correct voltage threshold levels.

Exemplary Operation

The following is a description of exemplary operation of one embodiment of a system for setting the voltage threshold levels of memory cells in a memory device according to the present invention. In the description of this embodiment, it will be assumed that a targeted order for the voltage threshold levels of the memory cells A, B, and C can be expressed as follows.

$$A-Vth < B-Vth < C-Vth$$

From the above, the desired order is that the voltage threshold for cell A is less than the voltage threshold for cell B, which is less than the voltage threshold for cell C. To achieve the above threshold relationships, the programming signals PGM (1–3) can be used to individually change a programming pulse width for the drain voltage. In one example, to achieve the above voltage threshold relationships, the relationship of the overall programming pulse widths is given by the following.

$$PGM1 < PGM2 < PGM3$$

The above relationship is true since initially all three cells are programmed equally to achieve the desired A–Vth. Once the desire A–Vth is achieved, PGM1 disables further programming of cell A, and PGM2 and PGM3 are used to further program their respective cells to increase the Vth for those cells, and so on.

The first step in setting the threshold levels as desired above is that after one or more programming operations, cell A passes a program verify level where the desired voltage threshold A–Vth is achieved. After cell A has passed, the gate transistor TRA is turned off so that cell A does not receive additional program pulses.

The second step in setting the threshold levels for cells B and C is that the programming strength can be changed accordingly. For example, the WL voltage or drain voltage may be adjusted to reduce the programming strength. This change may be necessary because cell B and cell C have already been programmed to some degree and further programming of cell B or C may require weaker programming strength in order to prevent over-programming. With these new conditions, the program pulse width for the drain voltage can be changed just like the first step so that:

PGM2<PGM3

With this pulse width relationship, cell B first passes the next program verify level. After cell B passes this level, transistor TRB is turned off.

The third step in setting the threshold levels allows the programming strength for cell C to be changed. At this step, only cell C is programmed so that it will have the highest Vth. Therefore, since cell C was partially programmed in the previous steps, the weakest programming condition may be preferred here. By executing the above sequence, each cell can be programmed to targeted Vth levels respectively. Since multiple cells are programmed together, except in the final step where only one cell is programmed, the system conserves programming time. Furthermore, the system provides flexibility to change programming conditions depending on the targeted Vth.

One or more embodiments of the present invention can be effectively used in memory architectures that include dynamic references, where reference cells are located in the core cell area with the word line as core cells. For example, referring to FIG. 1, cell B may be a memory cell and cells A and C may be reference cells. In such an architecture, the reference cells may be programmed to different Vth levels from that of their respective core cells. Furthermore, the reference cells should be very accurate. Therefore, using one or more embodiments included in the present invention allows for efficiently changing the gating and programming conditions for the reference cells to obtain accurate threshold levels.

The present invention includes a system for setting voltage thresholds of memory cells in a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. Apparatus to set voltage threshold levels of a plurality of memory cells in a memory device, the plurality of memory cells are coupled to a common word line, the apparatus comprising:

a plurality of gates that are coupled between a voltage source and the plurality of memory cells, the gates include control inputs that receive control signals that open and close each gate, so that when a selected gate is closed, the voltage source is coupled to a selected memory cell and when the selected gate is open the voltage source is uncoupled from the selected memory cell; and control logic that generates the control signals to open and close the gates to individually enable and disable programming of the voltage threshold of each of the memory cells, wherein the control logic operates to receive results of a programming verify operation performed on the memory cells, and based on the results, the control logic operates to generate the control signals to open the gates associated with memory cells that passed the verify operation.

2. Apparatus to set voltage threshold levels of a plurality of memory cells in a memory device, the plurality of memory cells are coupled to a common word line, the apparatus comprising:

a plurality of gates that are coupled between a voltage source and the plurality of memory cells, the gates include control inputs that receive control signals that open and close each gate, so that when a selected gate is closed, the voltage source is coupled to a selected memory cell and when the selected gate is open the voltage source is uncoupled from the selected memory cell; and control logic that generates the control signals to open and close the gates to individually enable and disable programming of the voltage threshold of each of the memory cells, wherein the control logic operates to set all control signals to a first state when programming the voltage threshold of all memory cells, and wherein the control logic operates to selectively set one or more control signals to a second state to selectively set the voltage threshold of selected memory cells.

3. The apparatus of claim 2, wherein the control logic operates to selectively set the one or more control signals to the second state in a selected order, and wherein the selected order corresponds to setting the memory cells to have increasing voltage threshold values.

4. A method for setting voltage threshold levels of a plurality of memory cells in a memory device, the plurality of memory cells are coupled to a common word line, the method comprising steps of:

gating a voltage source to the plurality of memory cells to enable programming of the plurality of memory cells;

programming the enabled memory cells;

verifying that at least a portion of the plurality of memory cells are programmed with a correct voltage threshold;

disabling the voltage source to the at least a portion of the plurality of memory cells;

repeating the steps programming, verifying and disabling until the voltage threshold levels of the plurality of memory cell are set to selected levels.

5. The method of claim 4, wherein the step of gating comprises a step of gating the voltage source to the plurality of memory cells using a plurality of transistor gates that open and close in response to a plurality of gate signals, and wherein the gates are closed to enable programming of the plurality of memory cells.

6. The method of claim 5, wherein the step of disabling comprises a step of opening the transistor gates associated with the at least a portion of the plurality of memory cells.

7. The method of claim 4, further comprising a step of adjusting a strength characteristic of a programming system used in the step of programming.

8. The method of claim 7, wherein the step of repeating comprises a step of repeating the steps of programming, verifying, disabling, and adjusting until the voltage threshold levels of the plurality of memory cells are programmed to selected voltage threshold levels.

* * * * *